United States Patent [19]

Koons et al.

[11] 4,297,149

[45] Oct. 27, 1981

[54] METHOD OF TREATING SIPOS PASSIVATED HIGH VOLTAGE SEMICONDUCTOR DEVICE

[75] Inventors: Patrick R. Koons, Round Rock, Tex.; John M. S. Neilson, Mountaintop, Pa.

[73] Assignee: RCA Corporation, New York, N.Y.

[21] Appl. No.: 146,380

[22] Filed: May 5, 1980

[51] Int. Cl.$^3$ .................. H01L 21/265; H01L 21/205; G06F 15/46
[52] U.S. Cl. ...................................... 148/1.5; 148/187; 357/13; 357/59; 357/91
[58] Field of Search .................. 148/1.5, 187; 357/52, 357/59, 13, 91; 156/DIG. 73

[56] References Cited

U.S. PATENT DOCUMENTS 3,674,995 7/1972 Kendall .............................. 235/151.1
3,971,061 7/1976 Matsushita et al. .................... 357/52
4,001,873 1/1977 Kajiwara et al. ...................... 357/59

FOREIGN PATENT DOCUMENTS 300472 4/1968 Sweden .................................. 357/59

Primary Examiner—Upendra Roy
Attorney, Agent, or Firm—Birgit E. Morris; Donald S. Cohen; Robert P. Seitter

[57] ABSTRACT

The breakdown voltage of high voltage semiconductor devices passivated with SiPOS deteriorates if the devices are allowed to soak at temperatures in the 400° C. to 525° C. range. The original breakdown voltage is recovered by annealing the devices at a temperature of above about 550° C. prior to metallization and alloying the metal at less than 425° C.

6 Claims, No Drawings

METHOD OF TREATING SIPOS PASSIVATED HIGH VOLTAGE SEMICONDUCTOR DEVICE

BACKGROUND OF THE INVENTION

1. Field of the Invention

This invention relates to the field of passivation of high voltage semiconductor devices.

2. Prior art

Many passivation techniques have been utilized in prior art high voltage semiconductor devices. Passivation of the high voltage junction by depositing an oxygen doped polycrystalline silicon layer on the surface of the device bridging the junction has become a popular way to passivate semiconductor devices. For integrated circuits and other low voltage devices this is proved to be an effective passivation technique. As a result it has been used for the passivation of high voltage semiconductor devices.

3. The problem

In attempting to apply oxygen doped polycrystalline silicon as a passivation technique to high voltage semiconductor devices such as deflection transistors which have a design breakdown voltage of 1700 volts, we have discovered that the breakdown voltage of these devices is dependent on the thermal history of the device. We have found that allowing the devices to sit at 450° C. for as little as ten minutes will decrease the breakdown voltage by as much as 200 volts. Longer times will produce greater degradation of the breakdown voltage. We have determined that the primary range of temperature sensitivity for our devices is in the 400° C. to 525° C. range and that the most rapid deterioration occurs in the range of 450° C. to 500° C.

SUMMARY OF THE INVENTION

This problem is ameliorated by annealing the devices at a temperature above 525° C. prior to metallization and by alloying the metallization at a temperature of less than 425° C. for less than ten minutes above 400° C. Full voltage capability is recovered by annealing at above 550° C. prior to metallization.

DETAILED DESCRIPTION OF THE PREFERRED EMBODIMENT

Our 1700 volt breakdown voltage devices use depletion moats at the high voltage junction. The oxygen doped polycrystalline silicon (SiPOS) passivation layers on these devices are about 5500 Angstroms thick and are deposited at about 600° C. from source gases comprising about 20% $N_2O$ and about 80% $SiH_4$. This SiPOS layer is deposited directly on the semiconductor surface. Subsequent to its deposition the SiPOS layer is annealed at 900° C. for from one-half hour to one hour.

The devices are subsequently metallized with aluminum and were alloyed in a tube furnace set at 450° C. The resulting finished devices had subsequently lower breakdown voltages than expected. Initially the cause of the problem was not understood because it was assumed that the metal alloying temperatures were low enough that they would not affect a SiPOS layer which had been annealed at 900° C. However, subsequent experimentation established that the maximum breakdown voltage is obtained by minimizing the time the devices spend in the 400° C. to 525° C. temperature range following the SiPOS anneal.

The device breakdown voltage does degrade in the 400° C. to 425° C. temperature range, but significant degradation does not accumulate until after more than ten minutes total time in this range.

If a device having an initial breakdown voltage of 1700 volts is allowed to soak at 450° C. for ten minutes the breakdown voltage will reduce to about 1500 volts. Continued exposure to this temperature results in continuing reduction in the breakdown voltage with an asymptote of about 800 volts.

It is thought that the decrease in breakdown voltage may be a result of changes in the types of oxygen-silicon bonds present in the oxygen doped polycrystalline silicon.

A device of this type whose breakdown voltage has decreased to 1300 volts will recover 90 to 95% of its original breakdown voltage if it is annealed at 525° C. for one-half hour. Such a device (1300 v breakdown) annealed at 550° C. for one-half hour will recover its full initial 1700 volt breakdown voltage.

We have found that the maximum breakdown voltage is provided by avoiding permitting the devices to soak in the 400°–525° C. temperature range subsequent to SiPOS anneal or by annealing the devices at above 550° C. prior to metallization if they have been permitted to sit in a 400°–525° C. environment. This anneal is carried out in a tube furnace set at 550° C. At the end of the annealing time, the devices are pulled directly from the furnace to ambient air in order that they will cool rapidly through the 525° C.–400° C. temperature range. The devices are then metallized with aluminum or other appropriate metallization and the metallization is alloyed in a belt furnace with its peak temperature set at less than 425° C. for a maximum time of ten minutes above 400° C. The resulting devices have substantially their entire 1700 volt breakdown voltage.

The annealing at 550° C. is preferably utilized as a pre-metallization treatment to assure that devices will have maximum breakdown voltage even if through some error, oversight, or furnace loading effects in previous steps they have soaked in the forbidden temperature range at some point subsequent to the SiPOS anneal. When cooling the devices at the end of the SiPOS anneal it is preferred to cool them slowly to 550° C. and then rapidly through the problem temperature range. This substantially minimizes the problem of breakdown voltage loss in the event that subsequent high temperature steps are not performed.

Subsequent steps which make an annealing advisable include the fusing of a glass overcoat over the SiPOS junction passivation under conditions which may result in excessive soaking in the 400° C. to 525° C. temperature range.

A processing technique for obtaining maximum breakdown voltage for semiconductor devices which are passivated with SiPOS has been described. Those skilled in the art will be able to modify the preferred embodiment in view of the teachings of the specification without departing from the spirit of the invention as defined in appended claims.

What is claimed is:

1. In a process of fabricating a semiconductor device having oxygenated polycrystalline silicon passivation layers the improvement comprising:
   annealing the devices at at least 525° C. prior to metallization;
   cooling the devices rapidly through the 500° C. to 450° C. temperature range at the end of said annealing;

preventing the devices from subsequently being heated to any temperature higher than 425° C.; and preventing the devices from being exposed to any temperature above 400° C. for longer than a total of ten minutes subsequent to the annealing whereby the devices will have near the maximum breakdown voltage of which their structure is capable.

2. The method recited in claim 1 wherein:

said annealing step is performed at a temperature of at least 550° C.

3. The method recited in claim 1 wherein:

said annealing step is carried out for a period of at least one-half hour.

4. The method recited in claim 1 wherein subsequent to metal deposition:

the metal is alloyed with the semiconductor at a temperature in the range between 400° C. and 425° C.

5. The method recited in claim 1 wherein:

said rapid cooling is through the 525° C. to 400° C. temperature range.

6. A method of maximizing the breakdown voltage of semiconductor devices having oxygenated polycrystalline silicon passivation layers comprising:

annealing said devices at a temperature above 525° C. prior to metallizing the devices;

cooling said devices rapidly through the temperature range 525° C. to 425° C. following said annealing;

preventing said devices from being heated to above 425° C. subsequent to said annealing.

* * * * *